(12) United States Patent
Wieting

(10) Patent No.: US 8,377,736 B2
(45) Date of Patent: Feb. 19, 2013

(54) SYSTEM AND METHOD FOR TRANSFERRING SUBSTRATES IN LARGE SCALE PROCESSING OF CIGS AND/OR CIS DEVICES

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 13/343,202

(22) Filed: Jan. 4, 2012

(65) Prior Publication Data
US 2012/0122304 A1    May 17, 2012

Related U.S. Application Data

(63) Continuation of application No. 12/568,654, filed on Sep. 28, 2009, now abandoned.

(60) Provisional application No. 61/102,350, filed on Oct. 2, 2008.

(51) Int. Cl.
*H01L 21/00* (2006.01)

(52) U.S. Cl. .......... 438/85; 438/102; 257/613; 136/264; 136/265

(58) Field of Classification Search ........................ None
See application file for complete search history.

(56) References Cited

U.S. PATENT DOCUMENTS

| | | | |
|---|---|---|---|
| 3,520,732 A | 7/1970 | Nakayama et al. | |
| 3,975,211 A | 8/1976 | Shirland | |
| 4,062,038 A | 12/1977 | Cuomo et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,518,855 A | 5/1985 | Malak | |
| 4,532,372 A | 7/1985 | Nath et al. | |
| 4,542,255 A | 9/1985 | Tanner et al. | |
| 4,581,108 A | 4/1986 | Kapur et al. | |

(Continued)

FOREIGN PATENT DOCUMENTS

AU    1998/78651 B2    2/1999
AU    2001/40599 A1    8/2001

(Continued)

OTHER PUBLICATIONS

Baumann, A., et al., Photovoltaic Technology Review, presentation Dec. 6, 2004, 18 pages.

(Continued)

*Primary Examiner* — Evan Pert
*Assistant Examiner* — Andres Munoz
(74) *Attorney, Agent, or Firm* — Kilpatrick Townsend & Stockton LLP

(57) ABSTRACT

The present invention provides methods for fabricating a copper indium diselenide semiconductor film. The method includes providing a plurality of substrates having a copper and indium composite structure, and including a peripheral region, the peripheral region including a plurality of openings, the plurality of openings including at least a first opening and a second opening. The method includes transferring the plurality of substrates into a furnace, each of the plurality of substrates provided in a vertical orientation with respect to a direction of gravity, the furnace including a holding apparatus. The method further includes introducing a gaseous species into the furnace and transferring thermal energy into the furnace to increase a temperature from a first temperature to at least initiate formation of a copper indium diselenide film on each of the substrates.

16 Claims, 10 Drawing Sheets

U.S. PATENT DOCUMENTS

| | | | |
|---|---|---|---|
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A | 6/1988 | Vijayakumar et al. | |
| 4,775,425 A | 10/1988 | Guha et al. | |
| 4,798,660 A | 1/1989 | Ermer et al. | |
| 4,816,082 A | 3/1989 | Guha et al. | |
| 4,816,420 A | 3/1989 | Bozler et al. | |
| 4,837,182 A | 6/1989 | Bozler et al. | |
| 4,873,118 A | 10/1989 | Elias et al. | |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmon et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,397,401 A | 3/1995 | Toma et al. | |
| 5,399,504 A | 3/1995 | Ohsawa | |
| 5,445,847 A | 8/1995 | Wada et al. | |
| 5,474,939 A | 12/1995 | Pollock et al. | |
| 5,501,744 A | 3/1996 | Albright et al. | |
| 5,512,107 A | 4/1996 | Van den Berg | |
| 5,528,397 A | 6/1996 | Zavracky et al. | |
| 5,536,333 A | 7/1996 | Foote et al. | |
| 5,578,103 A | 11/1996 | Araujo et al. | |
| 5,578,503 A | 11/1996 | Karg et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,726,065 A | 3/1998 | Szlufcik et al. | |
| 5,738,731 A | 4/1998 | Shindo et al. | |
| 5,868,869 A | 2/1999 | Albright et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,107,562 A | 8/2000 | Hashimoto et al. | |
| 6,127,202 A | 10/2000 | Kapur et al. | |
| 6,166,319 A | 12/2000 | Matsuyama | |
| 6,172,297 B1 | 1/2001 | Hezel et al. | |
| 6,258,620 B1 | 7/2001 | Morel et al. | |
| 6,294,274 B1 | 9/2001 | Kawazoe et al. | |
| 6,307,148 B1 | 10/2001 | Takeuchi et al. | |
| 6,323,417 B1 | 11/2001 | Gillespie et al. | |
| 6,328,871 B1 | 12/2001 | Ding et al. | |
| 6,361,718 B1 | 3/2002 | Shinmo et al. | |
| 6,372,538 B1 | 4/2002 | Wendt et al. | |
| 6,423,565 B1 | 7/2002 | Barth et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 | 2/2007 | Ramanathan et al. | |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,319,190 B2 | 1/2008 | Tuttle | |
| 7,364,808 B2 | 4/2008 | Sato et al. | |
| 7,442,413 B2 | 10/2008 | Zwaap et al. | |
| 7,544,884 B2 | 6/2009 | Hollars | |
| 7,736,755 B2 | 6/2010 | Igarashi et al. | |
| 7,741,560 B2 | 6/2010 | Yonezawa | |
| 7,855,089 B2 | 12/2010 | Farris, III et al. | |
| 7,863,074 B2 | 1/2011 | Wieting | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,142,521 B2 | 3/2012 | Wieting | |
| 8,178,370 B2 | 5/2012 | Lee et al. | |
| 2002/0002992 A1 | 1/2002 | Kariya et al. | |
| 2002/0004302 A1 | 1/2002 | Fukumoto et al. | |
| 2002/0061361 A1 | 5/2002 | Nakahara et al. | |
| 2002/0063065 A1 | 5/2002 | Sonoda et al. | |
| 2003/0075717 A1 | 4/2003 | Kondo et al. | |
| 2003/0089899 A1 | 5/2003 | Lieber et al. | |
| 2003/0188777 A1 | 10/2003 | Gaudiana et al. | |
| 2004/0063320 A1 | 4/2004 | Hollars | |
| 2004/0084080 A1 | 5/2004 | Sager et al. | |
| 2004/0095658 A1 | 5/2004 | Buretea et al. | |
| 2004/0110393 A1 | 6/2004 | Munzer et al. | |
| 2004/0187917 A1 | 9/2004 | Pichler | |
| 2004/0245912 A1 | 12/2004 | Thurk et al. | |
| 2004/0252488 A1 | 12/2004 | Thurk | |
| 2004/0256001 A1 | 12/2004 | Mitra et al. | |
| 2005/0074915 A1 | 4/2005 | Tuttle et al. | |
| 2005/0098205 A1 | 5/2005 | Roscheisen et al. | |
| 2005/0109392 A1 | 5/2005 | Hollars | |
| 2005/0164432 A1 | 7/2005 | Lieber et al. | |
| 2005/0194036 A1 | 9/2005 | Basol | |
| 2005/0287717 A1 | 12/2005 | Heald et al. | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0112983 A1 | 6/2006 | Parce et al. | |
| 2006/0130890 A1 | 6/2006 | Hantschel et al. | |
| 2006/0160261 A1 | 7/2006 | Sheats et al. | |
| 2006/0174932 A1 | 8/2006 | Usui et al. | |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2006/0249202 A1 | 11/2006 | Yoo et al. | |
| 2006/0267054 A1 | 11/2006 | Martin et al. | |
| 2007/0006914 A1 | 1/2007 | Lee | |
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |

| | | |
|---|---|---|
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki' |
| 2009/0021157 A1 | 1/2009 | Kim et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0267190 A1 | 10/2010 | Hakuma et al. |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0073181 A1 | 3/2011 | Wieting |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of CuInS2 Thin Films Solar Cells with Large Grain, Elsevier Science B.V; Solar Energy Materials & Solar Cells 69 (2001) pp. 261-269.

Salvador, "Hole diffusion length in n-TiO2 single crystals and sintered electrodes: photoelectrochemical determination and comparative analysis," Journa; of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

Copper Indium Gallium (CIG) Ratio:

$$\frac{Cu}{In}$$

$$\frac{Cu}{In + Ga}$$

~0.92-0.96 < 1

SYSTEM AND METHOD FOR TRANSFERRING SUBSTRATES IN LARGE SCALE PROCESSING OF CIGS AND/OR CIS DEVICES

CROSS-REFERENCE TO RELATED APPLICATION

This is a continuation patent application of U.S. application Ser. No. 12/568,654, filed Sep. 28, 2009, now abandoned entitled "System and Method for Transferring Substrates in Large Scale Processing of CIGS and/or CIS Devices," which claims benefit to U.S. Provisional Application No. 61/102,350, filed on Oct. 2, 2008, entitled "System and Method for Transferring Substrates in Large Scale Processing of CIGS and/or CIS Devices." The entire contents of which are incorporated herein by reference for all purposes.

BACKGROUND OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

In the process of manufacturing CIS and/or CIGS types of thin films, there are various manufacturing challenges, such as maintaining structure integrity of substrate materials, ensuring uniformity and granularity of the thin film material, etc. Some of the difficulties in manufacturing are associated with transferring substrates to processing chambers, as substrates for CIS and/or CIGS devices are relatively heavy (e.g., 10 pounds per substrate). While conventional techniques in the past have addressed some of these issues, they are often inadequate in various situations. Therefore, it is desirable to have improved systems and method for manufacturing thin film photovoltaic devices.

BRIEF SUMMARY OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

According to an embodiment, the present invention provide method for fabricating a copper indium diselenide semiconductor film. The method includes providing a plurality of substrates, each of the substrates having a copper and indium composite structure, each of the substrate including a peripheral region, the peripheral region including a plurality of openings, the plurality of openings including at least a first opening and a second opening. The method also includes transferring the plurality of substrates into a furnace, each of the plurality of substrates provided in a vertical orientation with respect to a direction of gravity, the plurality of substrates being defined by a number N, where N is greater than 5, the furnace including a holding apparatus, the holding apparatus including a first elongated member being configured to hang each of the substrates using at least the first opening. The method further includes introducing a gaseous species including a hydrogen species and a selenide species and a carrier gas into the furnace and transferring thermal energy into the furnace to increase a temperature from a first temperature to a second temperature, the second temperature ranging from about 350° C. to about 450° C. to at least initiate formation of a copper indium diselenide film from the copper and indium composite structure on each of the substrates. Also, the method includes maintaining the temperature at about the second temperature for a period of time. The method additionally includes removing at least the selenide species from the furnace. The method also includes introducing a hydrogen sulfide species into the furnace. The method also includes increasing a temperature to a third temperature, the third temperature ranging from about 500 to 525° C. while the plurality of substrates are maintained in an environment including a sulfur species to extract out one or more selenium species from the copper indium diselenide film.

According to another embodiment, the present invention provides a partially processed semiconductor device. The device includes a substrate member characterized by a first thickness and a first surface area, the substrate member being characterized by a substantially rectangular shape, the substrate member including a peripheral region, the peripheral region being smaller 15% of the first surface area, the peripheral region including a plurality of openings, the plurality of openings including at least a first opening and a second opening. The device also includes a first contact layer overlaying the substrate member, the second contact layer being characterized by a second thickness and a first conductivity. The device further includes a semiconductor layer overlaying the first contact layer, the semiconductor comprises copper and indium material.

It is to be appreciated that the present invention provides numerous benefits over conventional techniques. Among other things, the systems and processes of the present invention are compatible with conventional systems, which allows cost effective implementation. In various embodiments, hanging device is provided within processing chamber to allow easy transfer and to ensure structure integrity of the CIS and/or CIGS devices. For example, the substrates are specific designed to be compatible with the hanging device. There are other benefits as well.

DETAILED DESCRIPTION OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

Figure 1:
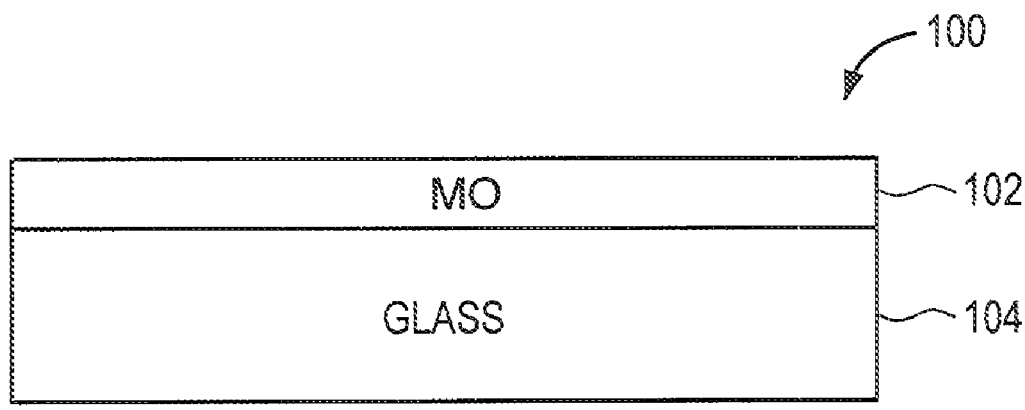
FIG. 1 is a simplified diagram of a transparent substrate with an overlying electrode layer according to an embodiment of the present invention.

FIG. 1 is a simplified diagram of a transparent substrate with an overlying electrode layer according to an embodiment of the present invention. This diagram is merely an example, which should not limit the scope of the claims herein. As shown, structure 100 includes a transparent substrate 104. In an embodiment, substrate 104 can be a glass substrate, for example, a soda lime glass. However, other types of substrates can also be used. Examples of substrates include borosilicate glass, acrylic glass, sugar glass, specialty Corning™ glass, and others. As shown, a contact layer comprising a metal electrode layer 102 is deposited upon substrate 104. According to an embodiment, the metal electrode layer 102 comprises metal material that is characterized by a predetermined conductivity that is optimized for thin-film based solar cell applications. Depending on the application, the metal electrode layer 102 may be deposited in various ways. For example, the metal electrode layer 102 comprises primarily a film of molybdenum that is deposited by sputtering. For example, the thickness may range from 100 to 600 µm. A sputtering apparatus, such as a DC magnetron sputtering apparatus, can be used to deposit a thin film of materials upon a substrate. Such apparatus is well known and commercially available. But it is to be understood that other types of equipments and/or processes, such as evaporation in vacuum based environment may be used as well. As an example, the sputtering deposition process is described below.

Sputter deposition is a physical vapor deposition (PVD) method of depositing thin films by sputtering, or ejecting, material from a "target", or source, which then deposits onto a substrate, such as a silicon wafer or glass. Sputtered atoms ejected from the target have a wide energy distribution, typically up to 10's of eV's (100000 K). The entire range from high-energy ballistic impact to low-energy thermalized motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

Figure 2:
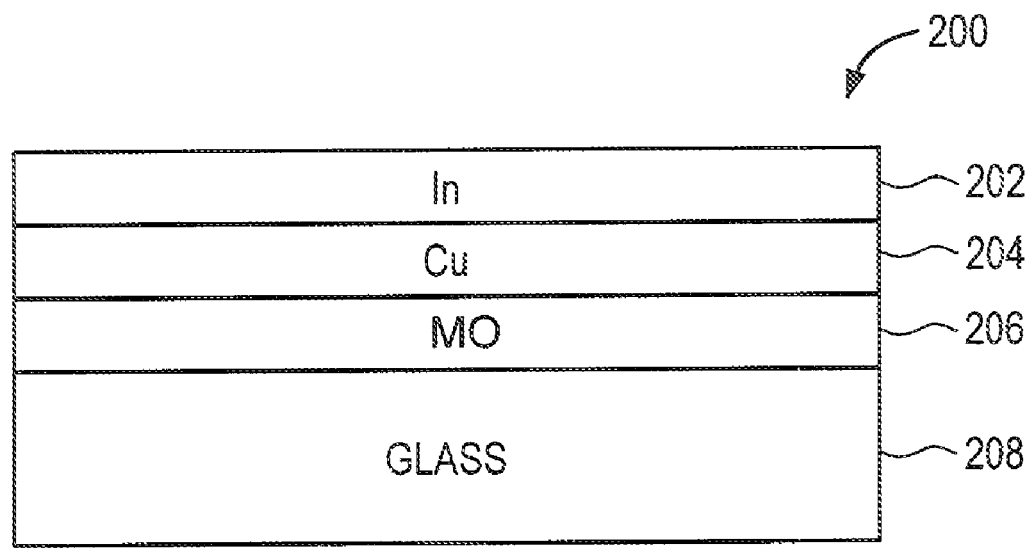
FIGS. 2, 2A, 2B and 2C are simplified diagrams of composite structures including a copper and indium film according to embodiments of the present invention.

FIG. 2 is a simplified diagram of a composite structure including copper and indium material according to an embodiment of the present invention. This diagram is merely an example, which should not limit the scope of the claims herein. In this embodiment, structure 200 is includes a glass substrate 208, preferably soda lime glass, which is about 1 to 3 millimeters thick. For example, the glass substrate 208 serves as an supporting layer. The metal layer 206 is deposited upon substrate 208. For example, the metal layer 206 serves as a metal electrode layer to provide electrical contact. For example, the layer 206 comprises primarily a film of molybdenum which has been deposited by sputtering to a thickness of from 100 to 300 m. In a specific embodiment, an initial film of chromium is first deposited upon glass 208. For example, the chromium is used as a barrier layer provided to insure good adhesion of the overall structure to the substrate 208. Other types of material may also be used in a barrier layer, such as silicon dioxide, silicon nitride, etc. Layers 204 and 202 include primarily a copper layer and an indium layer deposited upon metal layer 206 by a sputtering process. As shown in FIG. 2, the indium layer overlays the copper layer. But it is to be understood that other arrangements are possible. In another embodiment, the copper layer overlays the indium layer. As an example, a sputtering apparatus, such as a DC magnetron sputtering apparatus, is used to deposit the thin film (e.g., layer 202, 204, and/or 206) of materials upon a substrate. It is to be appreciated that various types of sputtering apparatus may be used. Such apparatus is well known and commercially available. Other material can also be used. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material. According to an embodiment, the ratio between the copper and indium material is less than 1 (e.g., 0.92~0.96); that is, less than one part of copper per one part of indium material.

Figure 2A:
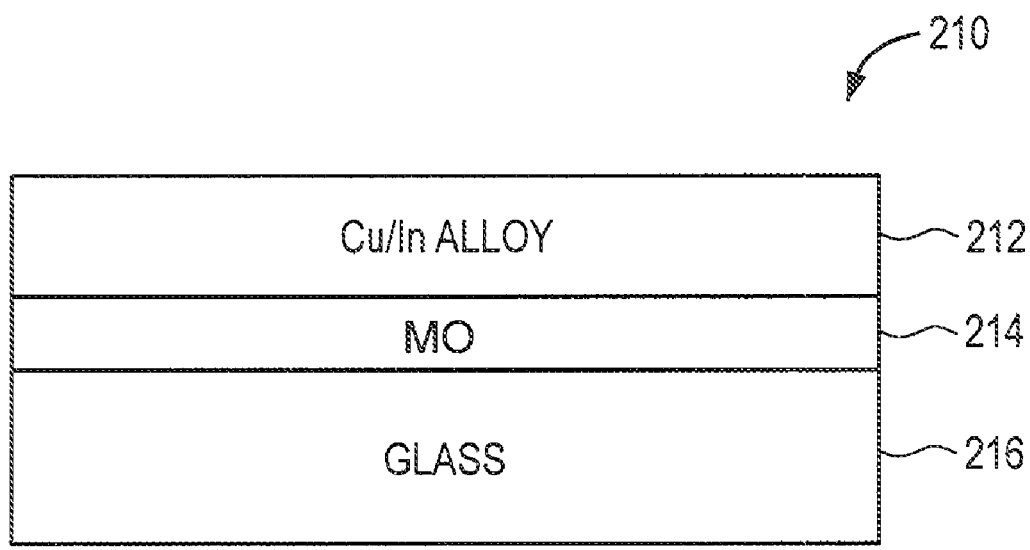

As an example, the structure 200 is formed by processing the structure 100. For example, the Cu and In are deposited onto the structure 100 to form the structure 200. As described, sputtering process is used for forming the copper and/or indium layer. In the embodiment illustrated in FIG. 2, the Cu film and the In film are shown as two separate layers. In another embodiment, a Cu/In composite or Cu/In alloy is formed during the sputtering process, as shown in FIG. 2A. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material FIG. 2A is a simplified diagram of a composite structure 210 including a copper and indium composite film according to another embodiment of the present invention. This diagram is merely an example, which should not limit the scope of the claims herein. As shown, the structure 210 includes a transparent substrate 216. In an embodiment, substrate 216 can be a glass substrate, for example, a soda lime glass. A back contact comprises a metal electrode layer 214 is deposited upon substrate 216. For example, the layer 214 comprises primarily a film of molybdenum material is deposited by sputtering. In a specific embodiment, an initial film of chromium is deposited upon glass 216 before depositing the chromium material to provide for good adhesion of the overall structure to the substrate 210. The layer 212 comprises primarily a copper indium alloy or copper indium composite material. For example, the mixing or alloying of copper indium results in an improved homogeneity or advantageous morphology of the composite copper and indium film. This improved structure is carried over into the desired CIS film after the selenization step. According to an embodiment, an copper indium alloy material is formed from separate layers of copper and indium material, which diffuse into each. For example, the process of forming of copper indium alloy material is facilitate by providing subjecting the structure to a high temperature.

Figure 2B:
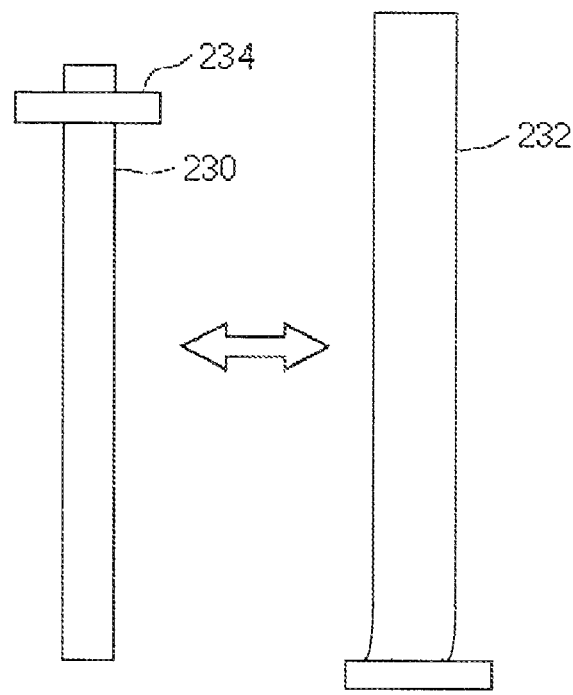

As an example, in FIGS. 2 and 2A the structures includes a substrate member supporting conducting and semiconductor layers. As explained above, depending on the application, various types of material may be used to make the substrate member. For thin-film based solar cell application, glass (e.g., such as lime glass) is used to provide the substrate member. Typically, the substrate members become soft and flexible under exposure to high temperature, especially when under high temperature for extended period of time. For example, the glass substrate material would become flexible and soft when the structure is processed in a furnace when high temperature is applied to the structure to cause various reactions (such as introducing selenium to copper indium material of the semiconductor layer). When the substrate member becomes soft and flexible, it tends to deform, warp, and/or crack. For example, if the structures illustrated in FIGS. 2 and 2A are vertically placed inside a process chamber, where the structures stays vertical by resting its bottom side, the structure might warp. For example, the structure 232 in FIG. 2B illustrates the warping of the substrate member. When the substrate member is subjected to a high temperature, the weight the of the substrate member itself often causes the bottom portion, which is supporting most of the weight, to warp.

Therefore, it is to be appreciated that according to various embodiments of the present invention, a substrate member is specifically configured to allow it to be hang by its top portion while being processed in a processing chamber where the substrate member is subject to high temperatures (e.g., 350 degree Celsius and higher). As shown in FIG. 2B, a substrate member 230 stays straight because it is hung on a holding device 234 during processing. While the substrate member 230 is soft and flexible when it is subjected to high temperature, the gravity pulling straight down allows the substrate member 230 to stay straight and uniform.

Figure 2C:
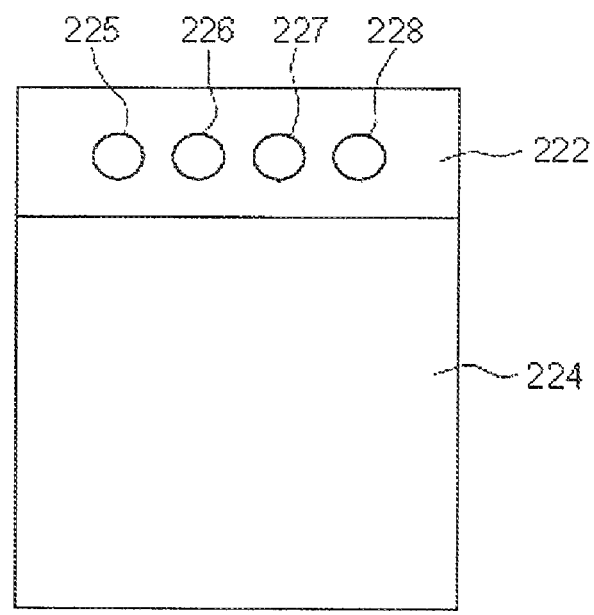

FIG. 2C is a simplified diagram illustrating a composite structure including copper and indium material according to an embodiment of the present invention. This diagram is merely an example, which should not limit the scope of the claims herein. As an example, the structure 220 shown in FIG. 2C may be a top view of the structures 100, 200, or 210. As shown, the structure 220 includes two portions 224 and 222. The portion 222 is a peripheral portion (i.e., being a part of the structure 220 for the purpose of providing openings that allows the structure to be hang in a processing chamber and/or on other systems). According to a specific embodiment, the peripheral portion is predefined and occupies less than 15% of the structure 220 total area.

Within the peripheral portion 222, there are openings 225, 226, 227, and 228. As shown, the opening are aligned on an axis. Depending on the application, the openings may be added, removed, modified, resized, replaced, rearranged, and/or reconfigured. The size and positions of the openings are optimized for the manufacturing processes. For example, the openings 225 and 228 are provided for hanging, while the opening 226 and 227 are provided for transfer, which will be described below. Among other things, the openings need to large enough to allow hanging device to go through. For example, the openings are characterized by a radius of about 10 mm. Also, the openings are positioned at a distance far enough (e.g., more than 10 mm) from the edge of the substrate to ensure that the region between the openings and the edge is strong enough hang the substrate.

Figure 3:
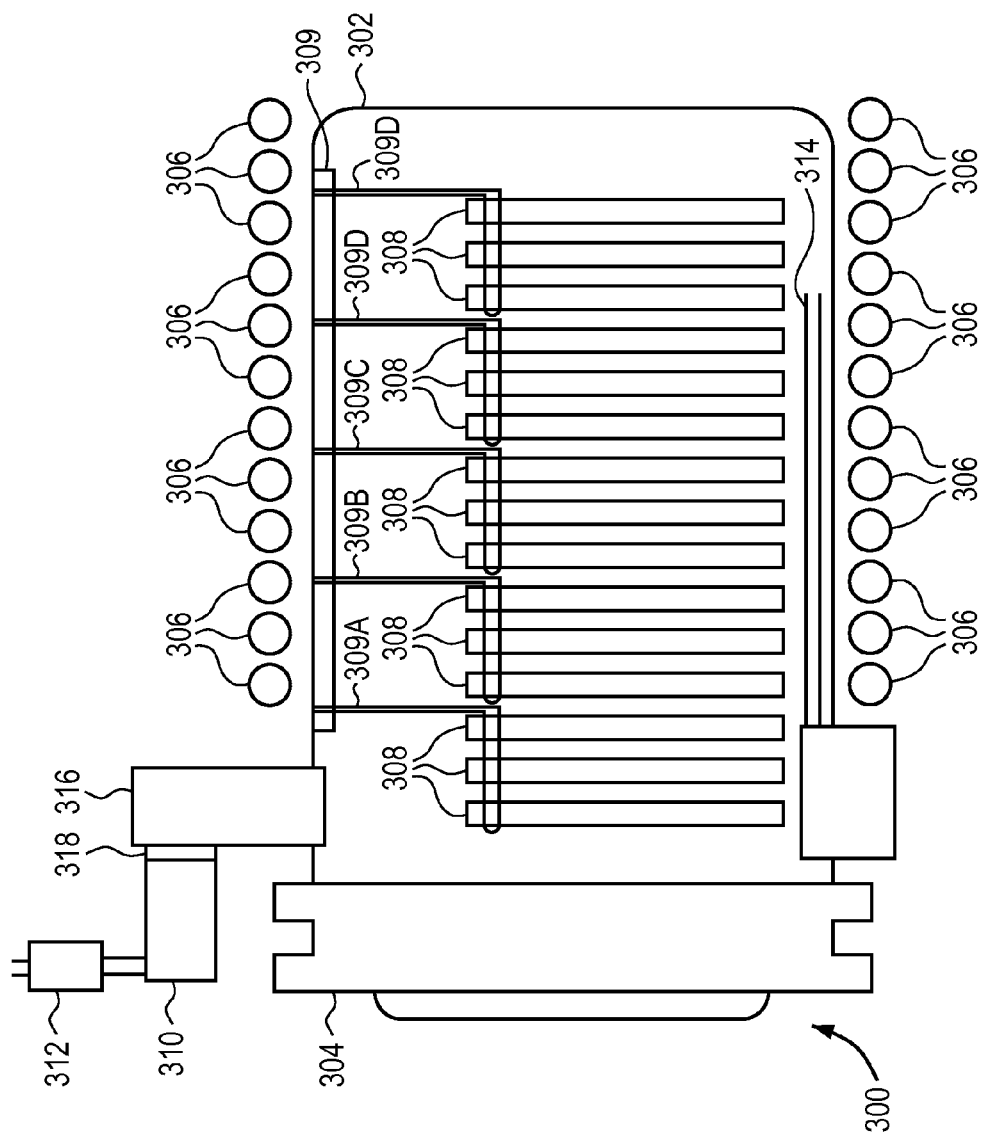
FIGS. 3, 3A and 3B are simplified diagrams of furnaces according to embodiments of the present invention.

FIG. 3 is a simplified diagram of a furnace according to an embodiment of the present invention. This diagram is merely an example, which should not limit the scope of the claims herein. As shown, a furnace 300 includes a process chamber 302 and a chamber end cap 304. According to an embodiment, the reaction chamber 302 is characterized by a volume of more than 200 liters. As shown in FIG. 3, the furnace 300 includes a vacuum-pumping machine that comprises a turbo-molecular pump 310 and a rotary pump 312. Depending on the application, the vacuum-pumping machine can be implemented by way of a combination of a mechanical booster pump and a dry pump. For example, the raw material gas and/or a diluting gas such as helium, nitrogen, argon, or hydrogen can be introduced in process chamber 302 via a gas injection pipe 314, if demanded by the specific applications and/or processes. The chamber 302 is evacuated by the turbomolecular pump 310 via the rotary pump 312 that is connected with a manifold 316 via a gate valve and a conductance valve 318. For example, there are no special partitions in the manifold or in the reaction furnaces. A heating element 306 is mounted outside the reaction chamber 302.

The furnace includes a holding device 309 that is specific configured to hang substrate 308. In a specific embodiment, the holding device 309 includes elongated members 309A-E that are characterized by a size that allows these devices to go through the openings (e.g., openings 225 and 228 described above and illustrated in FIG. 2C) to hang one or more structures (e.g., structures 100, 200, and/or 300). The shape of the elongated members 309A-E is compatible with the spacing of substrate openings to allow these devices to go through the openings. Each of the elongated members as shown in FIG. 3 is designed to hang a predetermined number of substrates. As explained above, substrates for CIS and/or CIGS devices are typically made glass type material, which is relatively heavy. The elongated member are designed to have enough strength to hang the predetermined number of substrates of known weight. In a specific embodiment, the elongated members are made of heat-resistant non-metal material (e.g., quartz, ceramic, etc), since the temperature in the processing chamber might be high.

The furnace 300 can be used for many applications. According to an embodiment, the furnace 300 is used to apply thermal energy to various types of substrates and to introduce various types of gaseous species, among others. In an embodiment, one or more glass plates or substrates are positioned vertically near the center of chamber 302. As an example, substrates 308 can be similar to those described in FIGS. 2 and 2A (e.g., Cu/In layers or composite Cu/In layer overlying a metal contact layer on a substrate). These layers placed in the process chamber in the presence of a gas containing selenium, such as $H_2Se$. After annealing the material for a given period of time, the copper, indium and selenium interdiffuse and react to form a high quality copper indium diselenide (CIS) film. In case where the cooper, indium, and gallium material is provided, CIGS film may be formed.

Figure 3A:
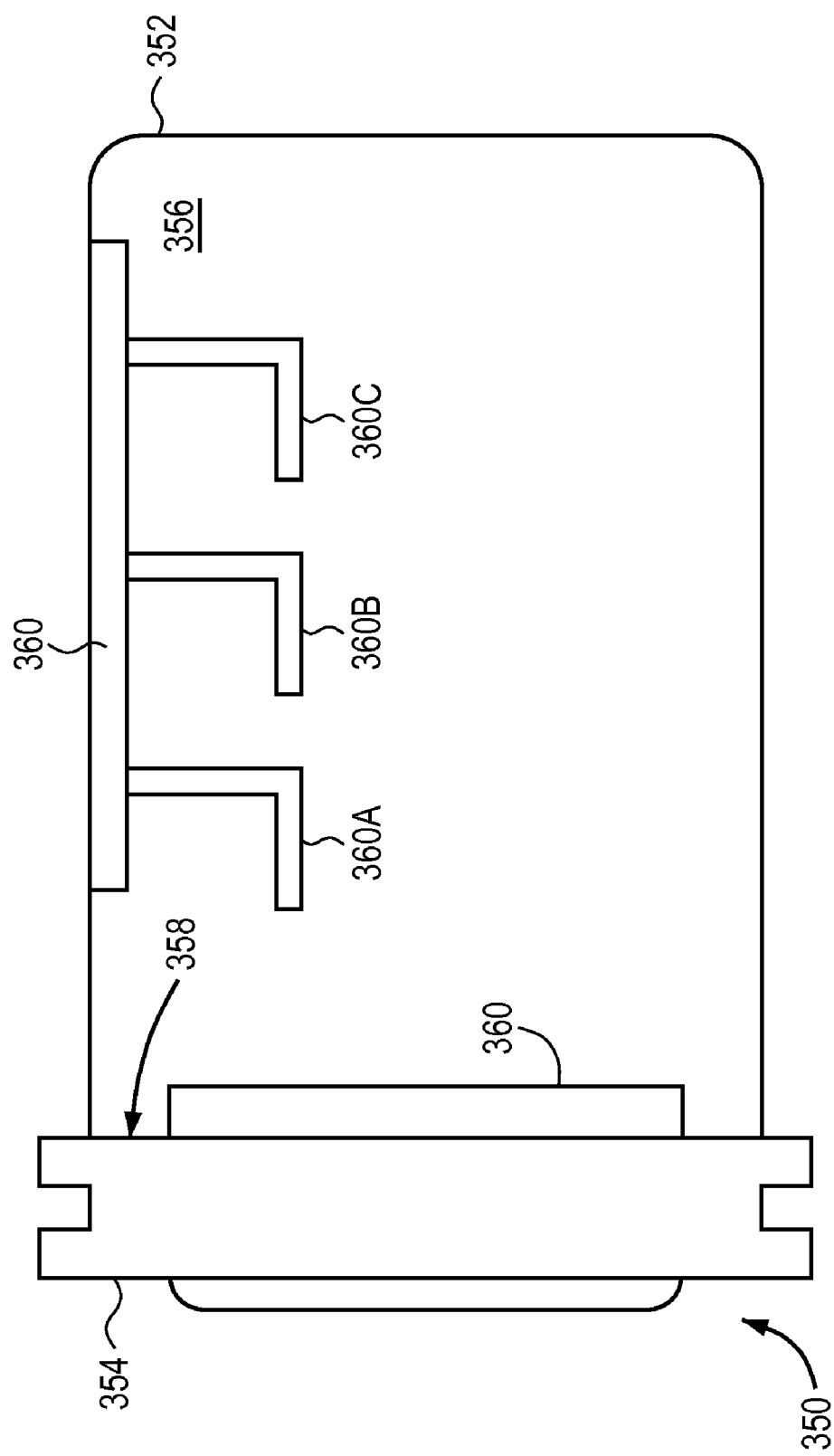

FIG. 3A is a simplified diagram illustrating a processing chamber according to an embodiment of the present invention. This diagram is merely an example, which should not limit the scope of the claims herein. As an example, the processing chamber 350 is a part of the furnace 300 described above and shares common structures with the furnace 300. As shown in FIG. 3A, the processing chamber 350 includes a hanging device 360, which includes elongated members 360A-C that are configured to fit into the openings of the substrates. In a specific embodiment, the hanging device 360 is removable from the processing chamber.

Depending on the application, the hanging device 350 may have a different numbers of elongated members for the purpose of hanging substrates. In a specific embodiment, the holding devices includes elongate members that are characterized by a size that allows these devices to go through the openings (e.g., openings 225 and 228 described above and illustrated in FIG. 2C) to hang one or more structures (e.g., structures 100, 200, and/or 300). The shape of the elongated members 309A-E is compatible with the spacing of substrate openings to allow these devices to go through the openings. Each of the elongated members as shown in FIG. 3 is designed to hang a predetermined number of substrates. As explained above, substrates for CIS and/or CIGS devices are typically made glass type material, which is relatively heavy. The elongated member are designed to have enough strength to hang the predetermined number of substrates of known weight. In a specific embodiment, the elongated members are made of heat-resistant non-metal material (e.g., quartz, ceramic, etc), since the temperature in the processing chamber might be high.

Figure 3B:
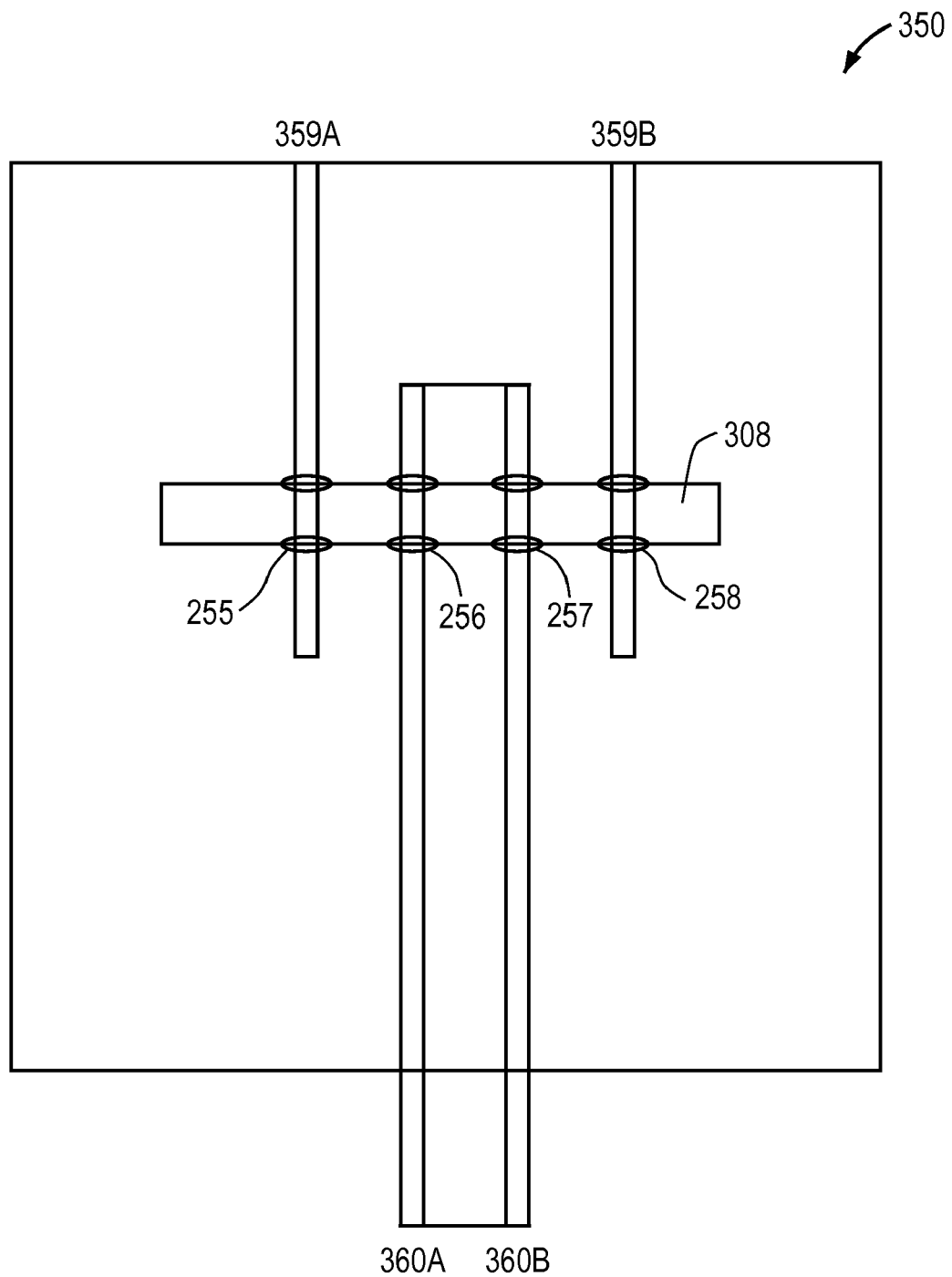

FIG. 3B is a top view of the processing chamber 350. As shown, the holding devices 359A and 359B, which are a part of a hanging device (e.g., hanging device 360 described above), are provided to hold the substrate 308 through openings 255, and 258. Transferring devices 360A and 360B (not shown in FIG. 3A) are provided to for transferring the substrate 308 in and out of the processing chamber 350. For example, when transferring the substrate 308 into the processing chamber, the substrate 308 is hang on the transferring devices 360A and 360B. The openings 255 and 258 are then aligned to match the position of holding devices 359A and 359B. Once the elongated members of the holding device 359A and 359B are through the openings 255 and 258, the transferring devices 360A and 360B is disengaged from the substrate 308. It is to be appreciated that substrates share substantially the same size and alignment of openings, a plurality of substrates can be transferred at once from transferring to the holding device inside the processing chamber.

Figure 4:
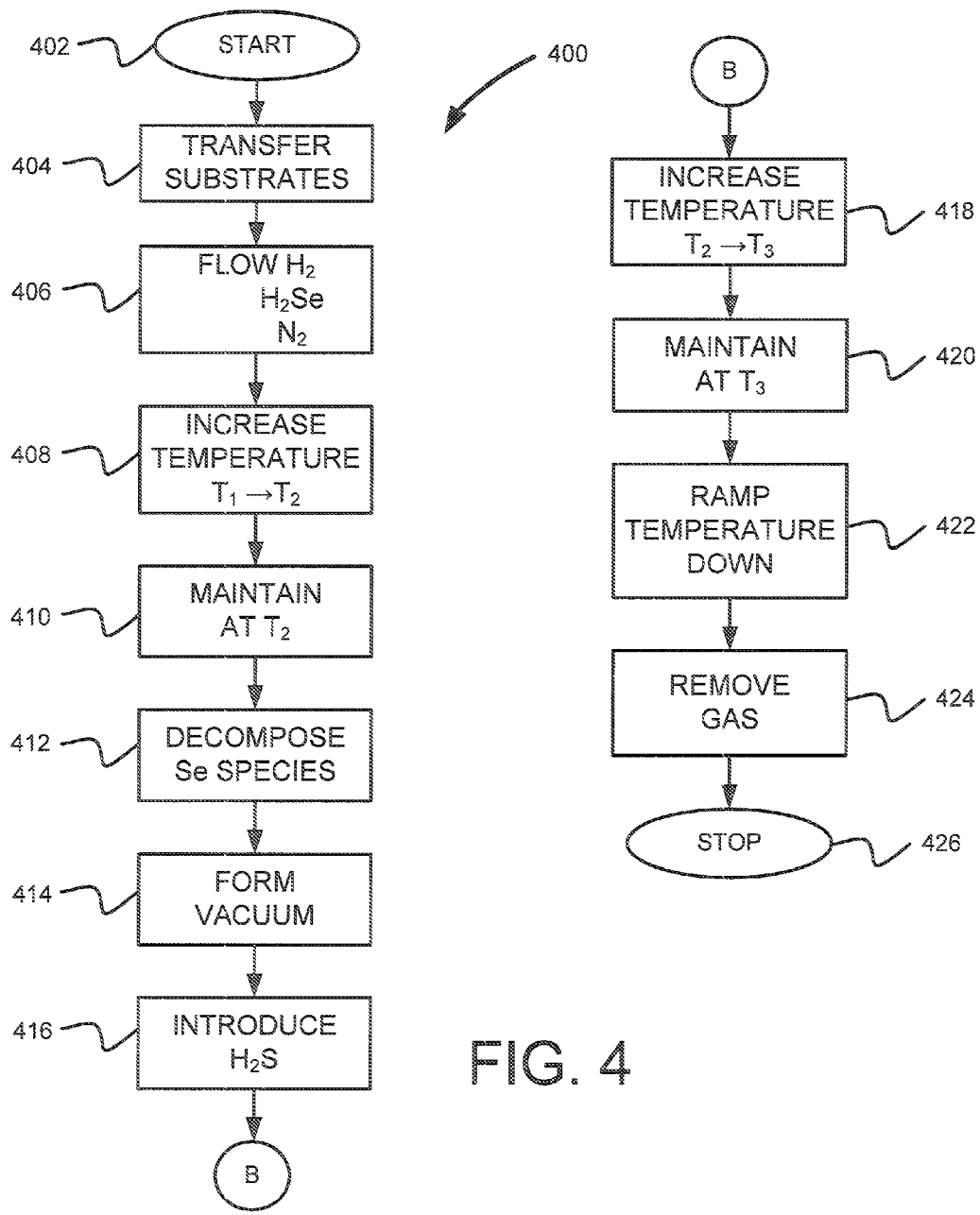
FIG. 4 is a simplified diagram of a process for forming a copper indium diselenide layer according to an embodiment of the present invention.

FIG. 4 is a simplified diagram of a process for forming a copper indium diselenide layer according to an embodiment of the present invention. This diagram is merely an example, which should not limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method can be briefly outlined below.
1. Start;
2. Provide a plurality of substrates having a copper and indium composite structure
3. Introduce a gaseous species including a hydrogen species and a selenide species and a carrier gas into the furnace;
4. Transfer thermal energy into the furnace to increase a temperature from a first temperature to a second temperature;
5. Maintain the temperature at about the second temperature for a period of time;
6. Remove at least the selenide species from the furnace;
7. Form vacuum in the process chamber;
8. Introduce a hydrogen sulfide species into the furnace;
9. Increasing the temperature to a third temperature;
10. Maintain the temperature at about the third temperature for a period of time;
11. Ramp down the temperature from the third temperature to about the first temperature;
12. Remove gas; and
13. Stop.

These steps are merely examples and should not limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention. As shown, the method 400 begins at start, step 402. Here, the user of the method begins at a process chamber, such as the one noted above, as well as others. The process chamber can be maintained at about room temperature before proceeding with the present method.

A plurality of substrates is transferred into the process chamber, step 404. Each of the plurality of substrates can be provided in a vertical orientation with respect to gravity. The plurality of substrates can be defined by a number N, where N is greater than 5. The plurality of substrates can comprise 5 or more individual substrates. In another embodiment, the plurality of substrates can comprise 40 or more individual substrates. For example, each substrate can have a dimension of 65 cm to 165 cm. But it is understood that other dimensions are possible. Each of the substrates is maintained in substantially a planar configuration free from warp or damage. For example, if the substrates were provided in an orientation other than vertical with respect to gravity, the gravitational force could cause the substrates to sag and warp. This occurs when the substrate material reaches a softening temperature, compromising the structural integrity of the substrate. Typically, glass substrates, particular soda lime glass substrates, begin to soften at 480° C. In an embodiment, the substrates are also separate from one another according to an predetermined spacing to ensure even heating and reactions with gaseous species that are to be introduced to the furnace. It is to be appreciated that since the substrates are hang from its top portion, the substrates are naturally aligned in a vertical orientation by the operation of gravity. In an embodiment, the substrates are also separate from one another according to an predetermined spacing to ensure even heating and reactions with gaseous species that are to be introduced to the furnace.

After the substrates are positioned into the process chamber, gaseous species, including a hydrogen species, a selenide species, and/or a carrier gas, are introduced into the process chamber in step 406. In an embodiment, the gaseous species includes at least $H_2Se$ and nitrogen. In another embodiment, the gaseous species other types of chemically inert gas, such as helium, argon, etc. For example, the substrates are placed in the presence of a gas containing selenium, such as $H_2Se$.

The furnace is then heated up to a second temperature ranging from about 350° C. to 450° C. in step 408. The transfer of thermal energy for the purpose of heating the process chamber can be done by heating elements, heating coils, and the like. For example, step 408, among other things, at least starts the formation of a copper indium diselenide film by reactions between the gaseous species and the copper and indium composite (or layered) structure on each of the substrates. In a specific embodiment, separate layers of copper and indium material are diffused into each other to corm a single layer of copper indium alloy material. The second temperature is maintained for 10 to 60 minutes (period of time) at the heat treatment interval between 350 and 450° C., step 410. In another embodiment, the second temperature range can be from 390 to 410° C. For example, the period of time for maintaining the temperature at step 410 is provided to allow formation of the CIS film material. As the temperature increases, the pressure inside the furnace may increase as well. In a specific embodiment, a pressure release valve is used to keep the pressure within the furnace at approximately 650 torr.

During the temperature hold (step 410), the removal of the selenide species begins, in step 412. A vacuum is formed in the process chamber through a vacuum pump, in step 414. Once the vacuum is created in the process chamber (step 414), a hydrogen sulfide species is introduced, in step 416. In a specific embodiment, the selenide removal process may continue until the process chamber is in vacuum configuration.

After the gas ambience in the furnace has been changed such that the selenide species is removed and the hydrogen sulfide species is introduced, a second temperature ramp up process is initiated, step 418. In a specific embodiment, the selenide species is introduced with nitrogen, which functions as a carrier gas. The temperature of the furnace is increased to a third temperature ranging from about 500 to 525° C. For example, the third temperature is calibrated for reaction between the hydrogen sulfide species and the substrates in furnace.

At step 420, temperature is maintained at the third temperature for a period of time until the formation of the CIS layers is completed. The maintaining of time at this interval in the ambience of the furnace comprising the sulfur species is set up according to the purpose of extracting out one or more selenium species from the copper indium diselenide film. It is to be appreciate that a predetermined amount of selenium species are removed. In a specific embodiment, approximately 5% of the selenium species is removed and is replaced by about 5% of sulfur. According to an embodiment, a complete reaction between the selenium material with the CIS film is desired. After the removal of selenium species, a temperature ramp down process is initiated, in step 422. The furnace is cooled to the first temperature of about room temperature, and the remaining gaseous species are removed from the furnace, in step 424. For example, the gaseous species are removed by a vacuum pumping machine. The temperature sequence described above can be illustrated in the temperature profile in FIG. 5.

After step 420, additional steps may be performed depending on the desired end product. For example, if a CIS or CIGS type of thin-film solar cell is desired, additional processes are provided to provide additional structures, such as a transparent layer of material such as ZnO overlaying the CIS layer.

It is also understood that the examples and embodiments described herein are for illustrative purposes only and that various modifications or changes in light thereof will be suggest to persons skilled in the art and are to be included within the spirit and purview of this application and scope of the appended claims.

Figure 5:
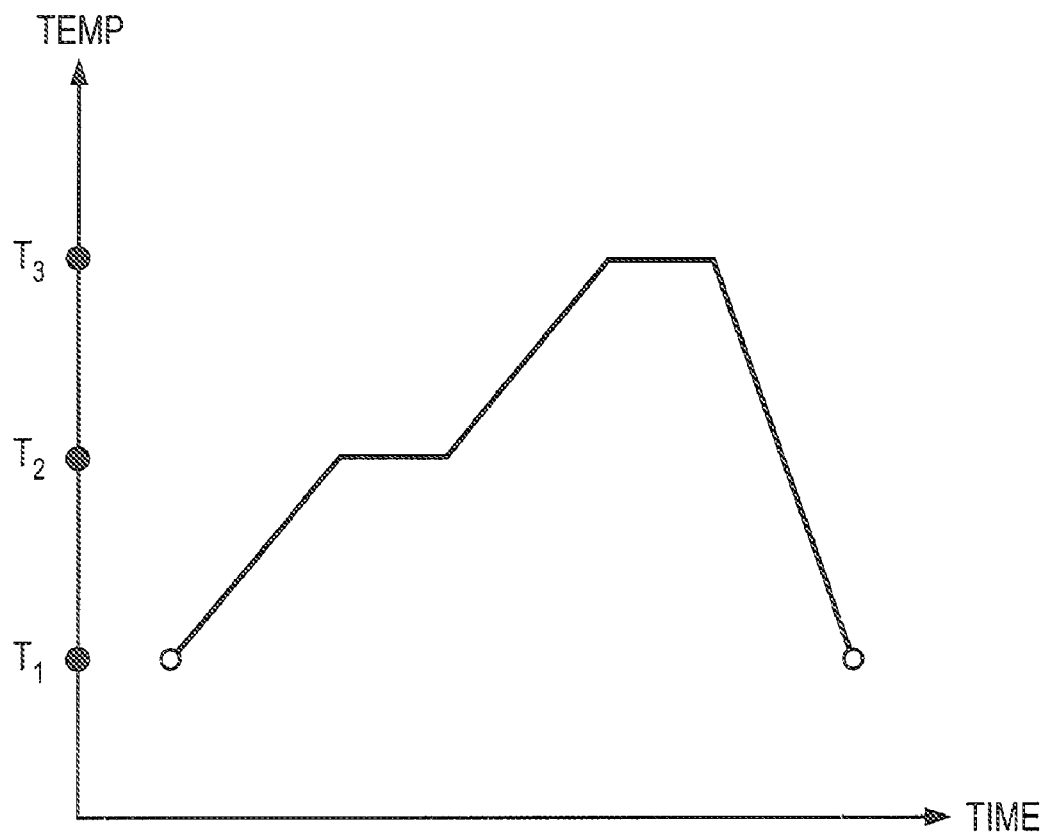
FIGS. 5 and 5A are simplified diagrams of a temperature profile of the furnace according to an embodiment of the present invention.

FIG. 5 is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5) is provided to illustrate a heating process according to an embodiment of the present invention. The optimized profile regulates the process chamber in order to prevent the warping of large substrates at high temperatures. If the temperature is ramped up too high too quickly, warping or damage may occur due to the softening of glass. In addition, the total amount of thermal energy is determined in consideration of total thermal budget available to the substrates and to maintain the uniformity and structure integrity of the glass substrate. For example, by periodically controlling the temperature of the heating process in steps, the substrate stays at a level of stabilization and relaxing in which the requisite structure integrity is maintained. As explained above, material such as glass tends to deform at a temperature of 480 degrees Celsius or higher, and thus caution is exercised to avoid prolong exposure of substrate at high temperatures. Referring to FIG. 5, while the ambience of a process chamber is maintained with a gaseous species including a hydrogen species and a selenide species and a carrier gas, a plurality of substrates is put into the furnace. The plurality of substrates is provided in a vertical orientation with respect to a direction of gravity, with the plurality of substrates being defined by a number N, where N is greater than 5. In an embodiment, the substrates include glass substrates, such as soda lime glass. The furnace is at a first temperature of about 30° C. (i.e., room temperature). The furnace is then heated up to a second temperature ranging from about 350° C. to 450° C.

The second temperature is maintained for 10 to 60 minutes (period of time) at the heat treatment interval between 350 to 450° C. A challenge in processing such large substrate is the warping of the substrate at high temperatures. If the temperature is ramped up directly to T3, warping or damage may occur. As shown, the slope of ramping up from T2 to T3 is calibrated to reduce and/or eliminate the risk of damaging the substrate. By maintaining the temperature in the process chamber at T2 for a period of time, the substrate can relax and stabilize. The maintaining time at this interval is set up according to the purpose of at least initiating formation of the copper indium deselenide film from the copper and indium composite structure on each of the substrates.

While the second temperature is maintained, the ambience of the furnace is changed such that the selenide species is removed and a hydrogen sulfide species is introduced.

After the gas ambience in the furnace has been changed such that the selenide species is removed and the hydrogen sulfide species is introduced, a second temperature ramp up process is initiated. In this process, the temperature of the furnace is increased to a third temperature ranging from about 500 to 525° C.

After the temperature ramp-up process, the temperature of the furnace is maintained for 10 to 40 minutes at the heat treatment interval between 500° C. and 525° C. The maintaining time at this interval in the ambience of the furnace comprising the sulfur and/or hydrogen sulfide species is set up according to the purpose of extracting out one or more selenium species from the copper indium diselenide film. As explained above, a predetermined amount (e.g., 5 to 10%) of selenium species is extracted to provide a proper amount of selenium concentration within the CIS film.

Figure 5A:
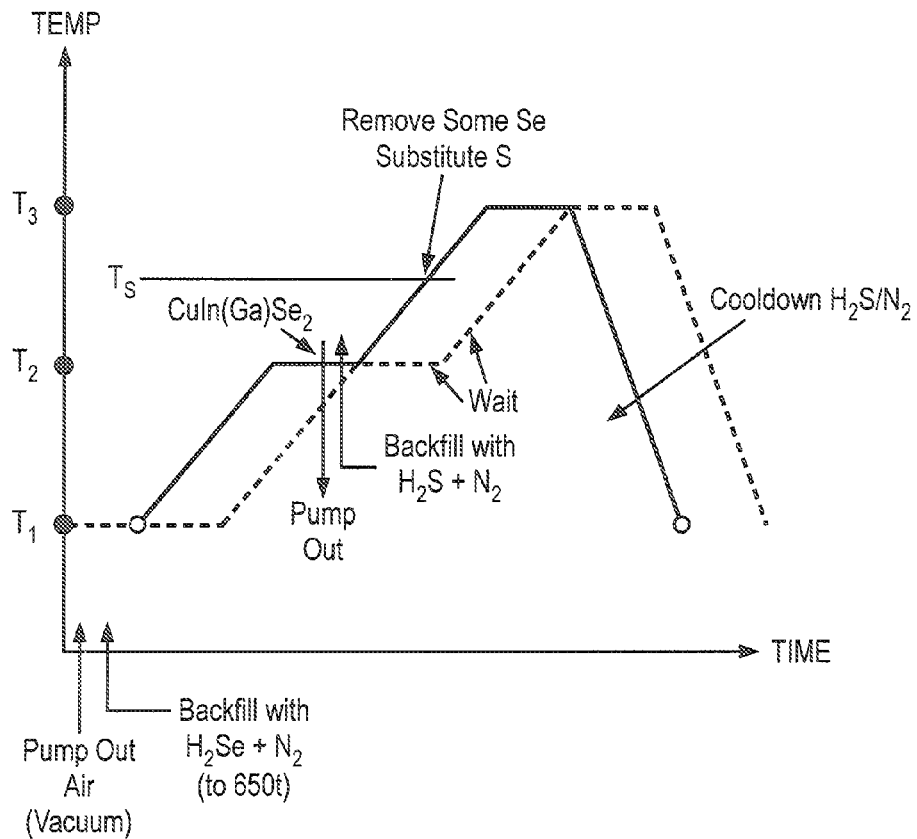
Figure 5A:
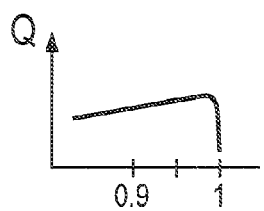

After the removal of selenium species, a temperature ramp-down process is initiated, as the furnace is then cooled to the first temperature of about room temperature. According to an embodiment, the cooling process is specifically calibrated. As a result of this process, the copper, indium, and selenium interdiffuse and react to form a high quality copper indium diselenide film. FIG. 5A is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5A) is provided to illustrate a heating process according to an embodiment of the present invention.

As shown in FIG. 5A, T1 is approximately at room temperature. At this temperature, substrates are loaded into a furnace. Air is pumped out (e.g., by vacuum device) from the furnace, and H2Se and N2 gas species are introduced into the furnace. For example, these gas species are introduced to the furnace so that at pressure of approximate 650 torr is reached.

Next temperature increases from T1 to T2 inside the furnace. For example, the rate of temperature ramping up is optimized to allow the relative uniform reaction between selenium and copper and indium (and possibly with addition of gallium). According to embodiments, the T2 temperature is approximately between 350 and 450° C. For example, the furnace stays at the T2 temperature for about 10 to 60 minutes. The time staying at the T2 temperature is to allow for reaction between selenium and copper indium material. In a specific embodiment, separate layers of copper and indium material form copper indium alloy while reacting with selenium material. As shown, CIS and/or CIGS material is formed at T2. During the temperature ramping up process, the pressure inside the furnace is controlled to sustain a relative uniform pressure level of approximate 650 torr. For example, a gas escape valve is used to release gases when the furnace heat up, where pressure increases due to gas expansion at high temperature.

After the CIGS material is formed, various gaseous species are again pumped out from the furnace. Then, H2S gas along with inert gases (e.g., nitrogen, argon, helium, etc.) are introduced to the furnace, and the temperature inside the furnace increases from T2 to T3. For example, T3 is approximately 500 to 550 degrees Celsius. In a specific embodiment, the temperature stays at T3 to allow the H2S to interact with the CIGS and/or CIS material. For example, the sulfur replaces approximately 3 to 10% of the selenium material from the CIGS and/or CIS material. After the reaction, H2S gas is removed from the furnace and the furnace cools down.

Figure 6A:
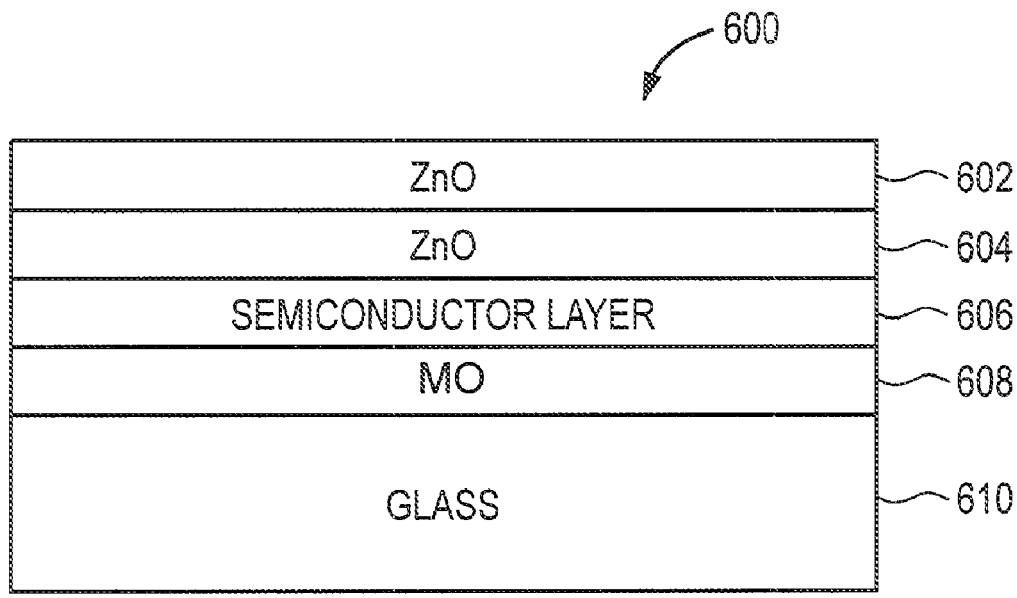
FIGS. 6A and 6B are simplified diagram of a thin film copper indium diselenide device according to an embodiment of the present invention.
Figure 6B:
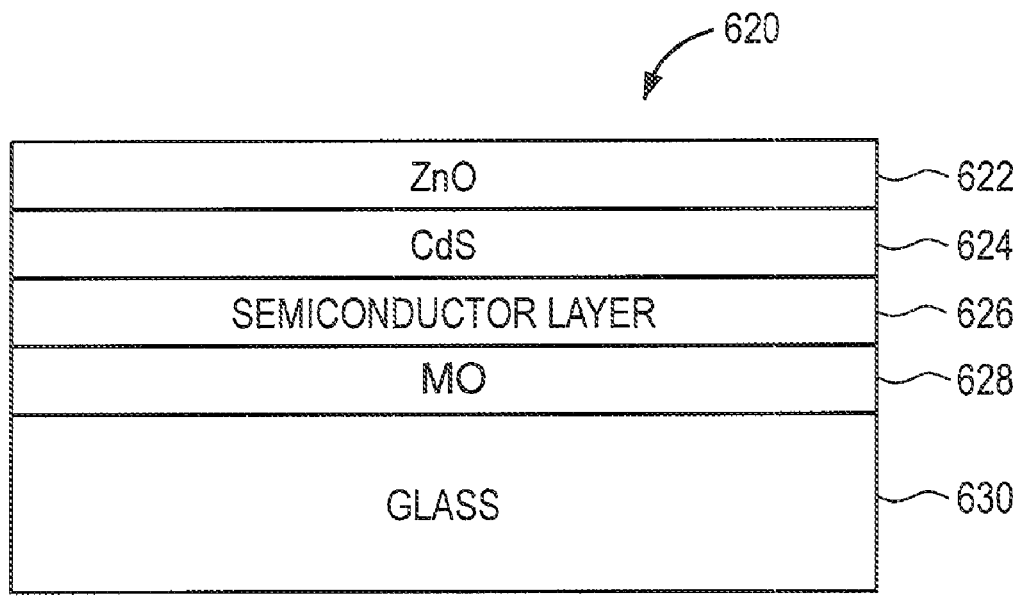

FIG. 6 is a simplified diagram of a thin film copper indium diselenide device according to an embodiment of the present invention. This diagram is merely an example, which should not limit the scope of the claims herein. As shown, structure 600 is supported on a glass substrate 610. According to an embodiment, the glass substrate comprises soda lime glass, which is about 1 to 3 millimeters thick. A back contact including a metal layer 608 is deposited upon substrate 610. According to an embodiment, layer 608 comprises primarily a film of molybdenum which has been deposited by sputtering. The first active region of the structure 600 comprises a semiconductor layer 606. In an embodiment, the semiconductor layer includes p-type copper indium deselenide (CIS) material. It is to be understood that other the semiconductor layer may include other types of material, such as CIGS, as shown. The second active portion of the structure 600 comprises layers 604 and 602 of n-type semiconductor material, such as CdS or ZnO. For example, in solar cell applications, the CdS and/or ZnO layers function as a winder layers. In FIG. 6, ZnO is shown overlaying the CdS layer. However, it should be understood that other variations are possible. In an alternative embodiments, the ZnO layer 602 overlays another ZnO layer that is characterized by a different resistivity.

A photovoltaic cell, or solar cell, such as device 600 described above, is configured as a large-area p-n junction. When photons in sunlight hit the photovoltaic cell, the photons may be reflected, pass through the transparent electrode layer, or become absorbed. The semiconductor layer absorbs the energy causing electron-hole pairs to be created. A photon needs to have greater energy than that of the band gap in order to excite an electron from the valence band into the conduction band. This allows the electrons to flow through the material to produce a current. The complementary positive charges, or holes, flow in the direction opposite of the electrons in a photovoltaic cell. A solar panel having many photovoltaic cells can convert solar energy into direct current electricity.

Semiconductors based on the copper indium diselenide (CIS) configuration are especially attractive for thin film solar cell application because of their high optical absorption coefficients and versatile optical and electrical characteristics. These characteristics can in principle be manipulated and tuned for a specific need in a given device. Selenium allows for better uniformity across the layer and so the number of recombination sites in the film are reduced which benefits the quantum efficiency and thus the conversion efficiency.

The present invention provides methods for making CIS-based and/or CIGS-based solar cells on a large glass substrate for a solar panel. The device structure described in FIG. 6 can be patterned into individual solar cells on the glass substrate and interconnected to form the solar panel. A cost-effective method for making thin film solar cell panel.

It will be appreciated that all of the benefits of the present invention can be achieved regardless of the order of deposition of the copper and indium films. That is, the indium could be deposited first or the films could be deposited as a sandwich or stack of thinner layers.

It is also understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. No. 4,611,091 and No. 4,612,411, which are hereby incorporated by reference herein, without departing from the invention described by the claims herein.

What is claimed is:

1. A method for fabricating a copper indium diselenide semiconductor film comprising:
   providing a plurality of substrates, each of the substrates having a copper and indium composite structure, each of the substrates including a peripheral region, the peripheral region including a plurality of openings, the plurality of openings including at least a first opening and a second opening;
   transferring the plurality of substrates into a furnace, each of the plurality of substrates provided in a vertical orientation with respect to a direction of gravity, the plurality of substrates being defined by a number N, where N is greater than 5, the furnace including a holding apparatus, the holding apparatus including a first elongated member being configured to hang each of the substrates using at least the first opening;
   introducing a gaseous species including a hydrogen species and a selenide species and a carrier gas into the furnace and transferring thermal energy into the furnace to increase a temperature from a first temperature to a second temperature, the second temperature ranging from about 350° C. to about 450° C. and initiating formation of a copper indium diselenide film from the copper and indium composite structure on each of the substrates;
   maintaining the temperature at about the second temperature for a period of time;
   removing at least the selenide species from the furnace;
   introducing a hydrogen sulfide species into the furnace;
   increasing a temperature to a third temperature, the third temperature ranging from about 500 to 525° C. while the plurality of substrates are maintained in an environment including a sulfur species to extract out one or more selenium species from the copper indium diselenide film.

2. The method of claim 1 further comprising removing the plurality of substrates from the furnace using a transferring device, the transferring device including at least a second elongated member that is configured to go through at least the second opening.

3. The method of claim 1 further comprising removing the peripheral region.

4. The method of claim 1 wherein the copper and indium composite structure further comprises gallium.

5. The method of claim 1 wherein a first amount of the selenium species is replaced by a second amount of the sulfur species in the copper indium diselenide film.

6. The method of claim 1 wherein the second temperature ranges from about 390° C. to about 410° C.

7. The method of claim 1 wherein the gaseous species comprises H2Se.

8. The method of claim 1 wherein:
   the holding apparatus includes a plurality of elongateds members, the plurality of elongated members includes a second elongated member;
   the first elongated member is configured to hang a first set of substrates, the first set of substrates including less than 8 substrates;
   the second elongated member configured to hang a second set of substrates, the second set of substrates including less than 8 substrates.

9. The method of claim 1 wherein the carrier gas comprises nitrogen gas.

10. The method of claim 1 wherein the furnace is characterized by a temperature profile having a uniformity of about less than 5% difference within the furnace.

11. The method of claim 1 wherein each of the substrates is maintained in a substantially planar configuration free from warp or damage.

12. The method of claim 1 further comprising maintaining the hydrogen sulfide species to a concentration ranging from about 10% to about 25% of a total volume within the furnace.

13. The method of claim 1 wherein the removing of the selenide species from the furnace occurs until the furnace is in a vacuum.

14. The method of claim 1 wherein the substrates further comprises a gallium material.

15. The method of claim 1 wherein the copper and indium composite structure comprises a copper and indium alloyed material.

16. The method of claim 1 wherein the copper and indium composite structure comprises a layer of copper material and a layer of indium material.

* * * * *